(12) United States Patent
Lin

(10) Patent No.: US 11,812,605 B2
(45) Date of Patent: Nov. 7, 2023

(54) SEMICONDUCTOR STRUCTURE WITH AIR GAPS FOR BURIED SEMICONDUCTOR GATE AND METHOD FOR FORMING THE SAME

(71) Applicant: Winbond Electronics Corp., Taichung (TW)

(72) Inventor: Chang-Hung Lin, Chiayi (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/147,094

(22) Filed: Jan. 12, 2021

(65) Prior Publication Data
US 2022/0223601 A1    Jul. 14, 2022

(51) Int. Cl.
| | | |
|---|---|---|
| H01L 21/768 | (2006.01) | |
| H01L 23/522 | (2006.01) | |
| H01L 23/00 | (2006.01) | |
| H01L 23/31 | (2006.01) | |
| H01L 23/495 | (2006.01) | |
| H01L 23/528 | (2006.01) | |
| H01L 23/532 | (2006.01) | |
| H10B 12/00 | (2023.01) | |
| H01L 29/423 | (2006.01) | |
| H01L 21/28 | (2006.01) | |
| H01L 21/764 | (2006.01) | |
| H01L 29/49 | (2006.01) | |

(52) U.S. Cl.
CPC ....... *H10B 12/34* (2023.02); *H01L 21/28123* (2013.01); *H01L 21/764* (2013.01); *H01L 29/4236* (2013.01); *H01L 29/4991* (2013.01); *H10B 12/053* (2023.02)

(58) Field of Classification Search
CPC ......... H01L 27/10823; H01L 21/28123; H01L 21/764; H01L 27/10876; H01L 29/4236; H01L 29/4991
See application file for complete search history.

(56) References Cited

U.S. PATENT DOCUMENTS

| | | | |
|---|---|---|---|
| 9,634,011 B2 | 4/2017 | Kang et al. | |
| 2007/0023784 A1* | 2/2007 | Schloesser | ........ H01L 27/10891 257/208 |
| 2014/0306351 A1* | 10/2014 | Kim | .................. H01L 21/76826 438/653 |
| 2015/0035050 A1* | 2/2015 | Yeom | ................ H01L 21/32133 257/532 |

(Continued)

OTHER PUBLICATIONS

Office Action and Search Report issued in corresponding TW patent application 109136646 dated May 7, 2021 (5 pages).
U.S. Appl. No. 16/788,691, filed Feb. 12, 2020.

*Primary Examiner* — Marcos D. Pizarro
*Assistant Examiner* — Tenley H Schofield
(74) *Attorney, Agent, or Firm* — Muncy, Geissler, Olds & Lowe, P.C.

(57) ABSTRACT

A semiconductor structure includes a semiconductor substrate and a gate structure embedded in the semiconductor substrate. The gate structure includes a gate electrode layer, a barrier layer disposed over the gate electrode layer, and a semiconductor layer disposed over the barrier layer. The semiconductor structure also includes an air gap in the semiconductor substrate and exposing the barrier layer and the semiconductor layer.

14 Claims, 9 Drawing Sheets

(56) References Cited

U.S. PATENT DOCUMENTS

| | | | |
|---|---|---|---|
| 2015/0214220 A1* | 7/2015 | Seo | H01L 29/4983 |
| | | | 257/499 |
| 2015/0221742 A1* | 8/2015 | Yi | H01L 27/10823 |
| | | | 257/295 |
| 2016/0181377 A1 | 6/2016 | Oh | |
| 2016/0372382 A1* | 12/2016 | Lee | H01L 21/823842 |
| 2018/0308850 A1 | 10/2018 | Kang et al. | |
| 2019/0165121 A1* | 5/2019 | Park | H01L 29/41775 |
| 2019/0221669 A1* | 7/2019 | Lee | H01L 29/7851 |
| 2021/0066466 A1* | 3/2021 | Kwon | H01L 27/10876 |
| 2021/0082756 A1* | 3/2021 | Tsai | H01L 21/76832 |

* cited by examiner

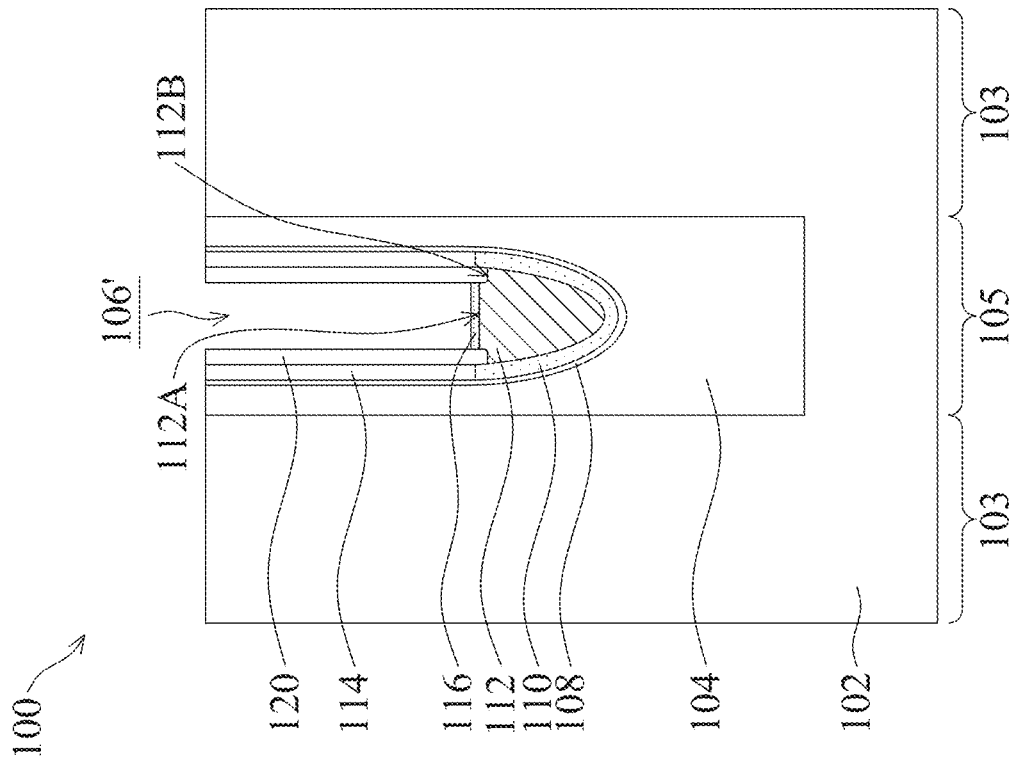
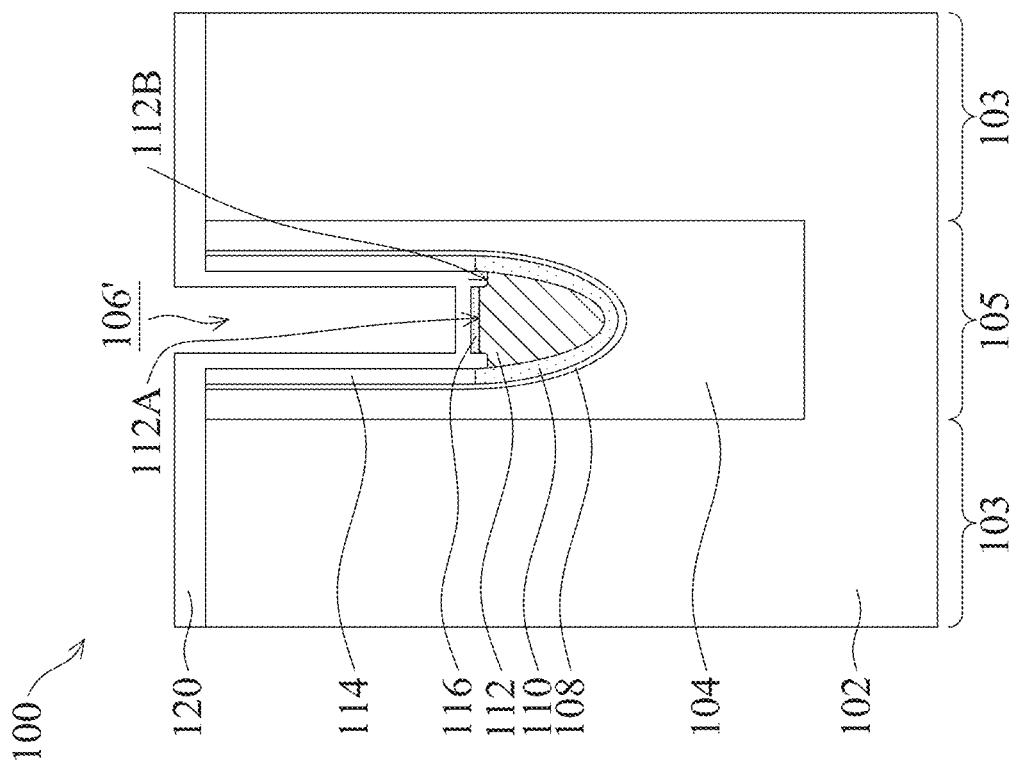

SEMICONDUCTOR STRUCTURE WITH AIR GAPS FOR BURIED SEMICONDUCTOR GATE AND METHOD FOR FORMING THE SAME

BACKGROUND

Field of the Disclosure

The present disclosure relates to a method for forming a semiconductor structure, and in particular, it relates to Dynamic Random Access Memory.

Description of the Related Art

Dynamic Random Access Memory (DRAM) devices are widely used in consumer electronic products. In order to increase element density in a DRAM device and improve its overall performance, existing technologies for fabricating DRAM devices continue to focus on scaling down the size of the elements. However, in scaling down the size of the minimum elements, new challenges arise, for example, improving gate induced drain leakage (GIDL). Therefore, there is a need in the industry to improve the method of fabricating DRAM devices to overcome problems caused by scaling down the size of the elements.

SUMMARY

In some embodiments of the disclosure, a semiconductor structure is provided. The semiconductor structure includes a semiconductor substrate and a gate structure embedded in the semiconductor substrate. The gate structure includes a gate electrode layer, a barrier layer disposed over the gate electrode layer, and a semiconductor layer disposed over the barrier layer. The semiconductor structure also includes an air gap in the semiconductor substrate and exposing the barrier layer and the semiconductor layer.

In some embodiments of the disclosure, a method for forming a semiconductor structure is provided. The method includes forming a trench in a semiconductor substrate, forming a gate lining layer along a lower portion of the trench, filling a gate electrode layer over the gate lining layer in the lower portion of the trench, forming a first sacrificial layer along a sidewall of an upper portion of the trench, forming a barrier layer along a sidewall of the first sacrificial layer and over a top surface of the gate electrode layer, and removing a first portion of the barrier layer along the sidewall of the first sacrificial layer, thereby leaving a second portion of the barrier layer over the top surface of the gate electrode layer. The method also includes forming a semiconductor layer over the second portion of the barrier layer, removing the first sacrificial layer, and forming a capping layer over the semiconductor layer.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. The thickness of the layers and regions in the figures may be enlarged for clarity, and the same or similar reference numbers in the figures are denoted as the same or similar elements.

Figure 1B:
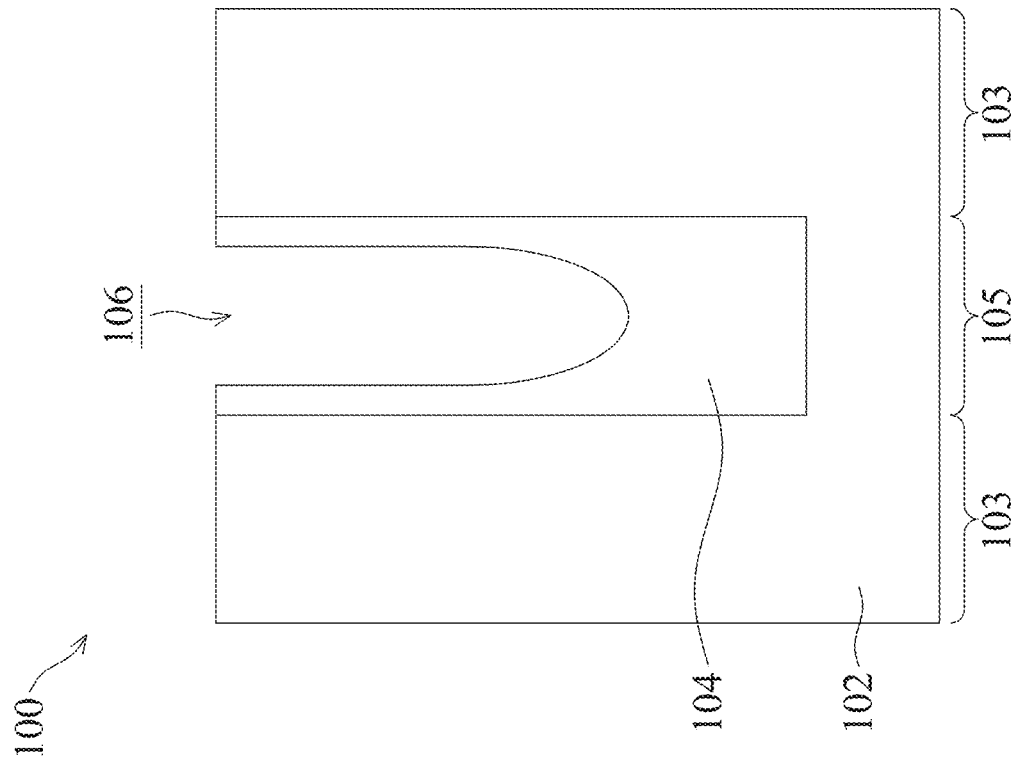
FIGS. 1A through 1O illustrate cross-sectional views of forming a semiconductor structure at various stages, in accordance with some embodiments of the present disclosure.
Figure 1A:
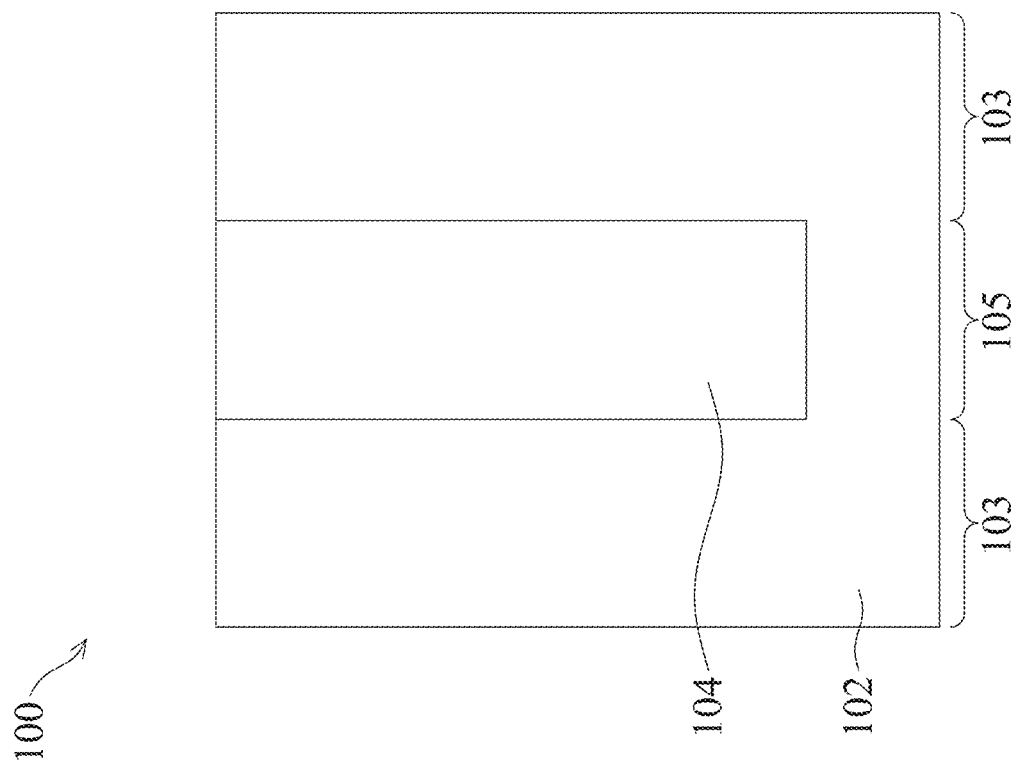
Figure 3:
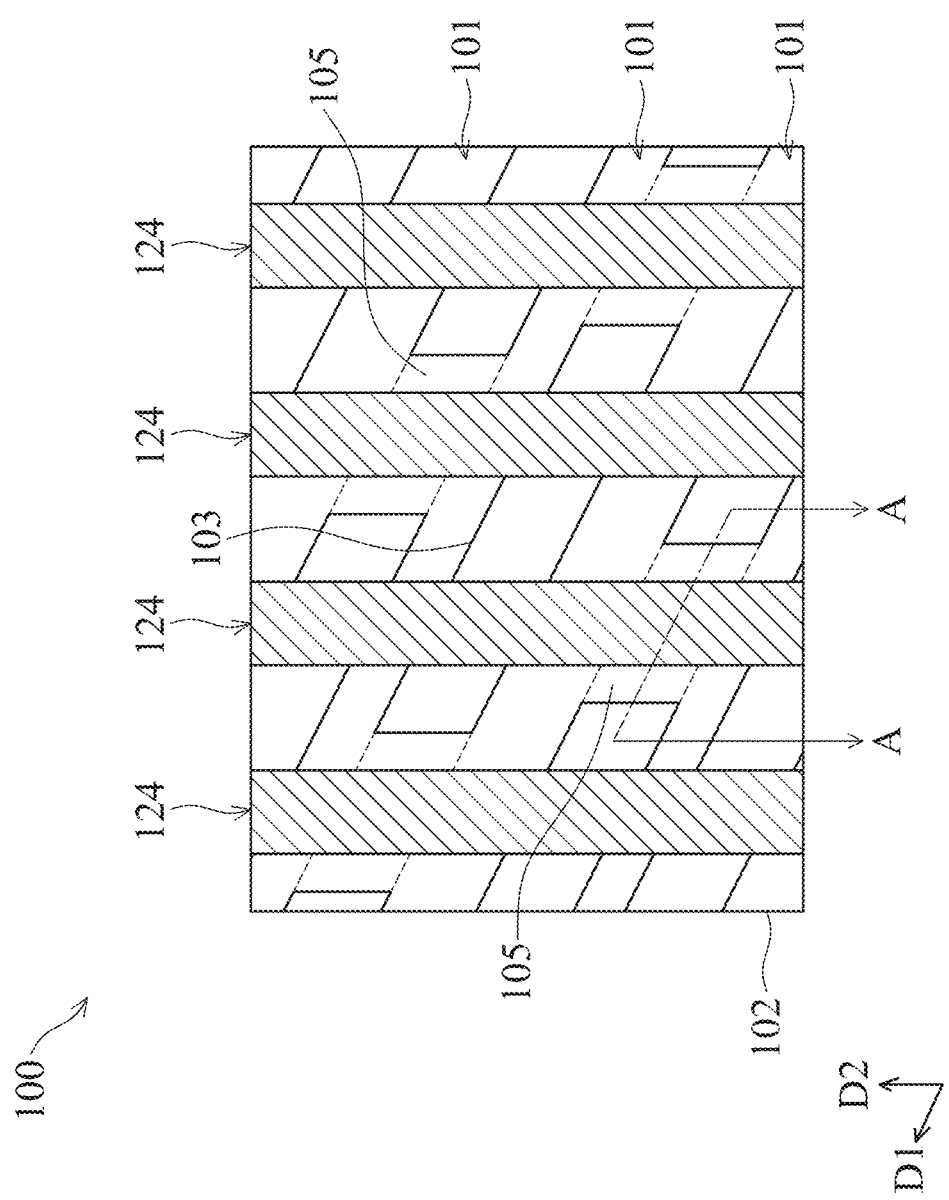
FIG. 3 is a plan view of a semiconductor structure, in accordance with some embodiments of the present disclosure.

FIGS. 1A through 1O illustrate cross-sectional views of forming a semiconductor structure at various stages, in accordance with some embodiments of the present disclosure. FIG. 3 is a plan view of a semiconductor structure in that FIGS. 1A through 1O are taken along cross-section A-A of FIG. 3, in accordance with some embodiments of the present disclosure.

FIG. 3 illustrates a semiconductor structure 100. The semiconductor structure 100 includes a semiconductor substrate 102. The semiconductor substrate 102 includes active regions 103, isolation regions 101, and chop regions 105. The active regions 103 are semiconductor blocks that extend along a first direction D1. Each of the active regions 103 is defined by two isolation regions 101 and two chop regions 105. An isolation structure (not shown) is formed in the isolation regions 101 and the chop regions 105, thereby surrounding and electrically isolating the active regions 103.

The isolation regions 101 extend along the first direction D1 and are spaced out from one another in a second direction D2, thereby dividing the semiconductor substrate 102 into multiple semiconductor strips (not shown). The first direction D1 is a channel-extending direction, and the second direction D2 is a gate-extending direction. The first direction D1 and the second direction D2 intersect at an acute angle that is in a range from about 10 degrees to about 80 degrees. The chop regions 105 (denoted by a broken line) are disposed corresponding to the semiconductor strips and cut the semiconductor strips into multiple active regions 103. Neighboring chop regions 105 arranged in the second direction D2 may be staggered with or do not overlaps with one another. For example, in the second direction D2, the chop regions 105 are arranged periodically (such as overlap), e.g., in a manner of several numbers (e.g., 2 to 5) of the semiconductor strips.

The semiconductor structure 100 also includes gate structures 124. The gate structures 124 are embedded in the semiconductor substrate 102 and extend along the second direction D2. Each of the gate structures 124 extends alternatively through the active regions 103 and the isolation structure. Two gate structures 124 extend into a single active region 103, and two gate structures 124 extend through the chop regions 105 that are on the opposite sides of the active region 103. FIG. 3 only illustrates the features described above for the clarity of the drawings. Other features of the semiconductor structure 100 may be shown in FIGS. 1A through 1O which are taken along cross-section A-A of FIG. 3.

A method for forming a semiconductor structure is described below. Referring to FIG. 1A, a semiconductor substrate 102 is provided and an isolation structure 104 is formed in the semiconductor substrate 102. In some embodiments, the semiconductor substrate 102 may be an elemental semiconductor substrate, such as a silicon substrate or a germanium substrate; a compound semiconductor substrate, such as a silicon carbide substrate or a gallium arsenide substrate. In some embodiments, the semiconductor substrate 102 may be a semiconductor-on-insulator (SOI) substrate.

An isolation structure 104 extends downwardly from the upper surface of the semiconductor substrate 102. The isolation structure 104 is configured to define the active region 103 of the semiconductor substrate 102. In some embodiments, the isolation structure 104 is made of dielectric material such as silicon nitride (SiN), silicon oxide (SiO), silicon oxynitride (SiON), and/or a combination thereof.

The formation of the isolation structure may include forming trenches corresponding to the isolation regions 101 and the chop regions 105 using one or more etching processes, and then depositing the dielectric material for the isolation structure 104 using chemical vapor deposition (CVD) and/or atomic layer deposition (ALD). Afterward, a planarization process such as an etching back process or chemical mechanical polishing (CMP) is performed on the semiconductor structure 100.

A patterning process is performed on the semiconductor structure 100 to form a trench 106 in the semiconductor substrate 102, as shown in FIG. 1B. The trench 106 extends through the isolation structure 104 and the active region 103 of the semiconductor substrate 102. FIG. 1B only illustrates a portion of the trench 106 in the isolation structure 104. The trench also includes another portion in the active region 103 of the semiconductor substrate 102.

The patterning process may include one or more deposition processes, one or more etching processes, and one or more photolithography processes. For example, a hard mask layer may be formed over the semiconductor substrate 102 using deposition processes. A patterned photoresist layer may be formed over the hard mask layer using photolithography processes. An opening pattern of the patterned photoresist layer may be transferred into the hard mask layer, and then into the semiconductor substrate 102, thereby forming the trench 106.

Figure 1D:
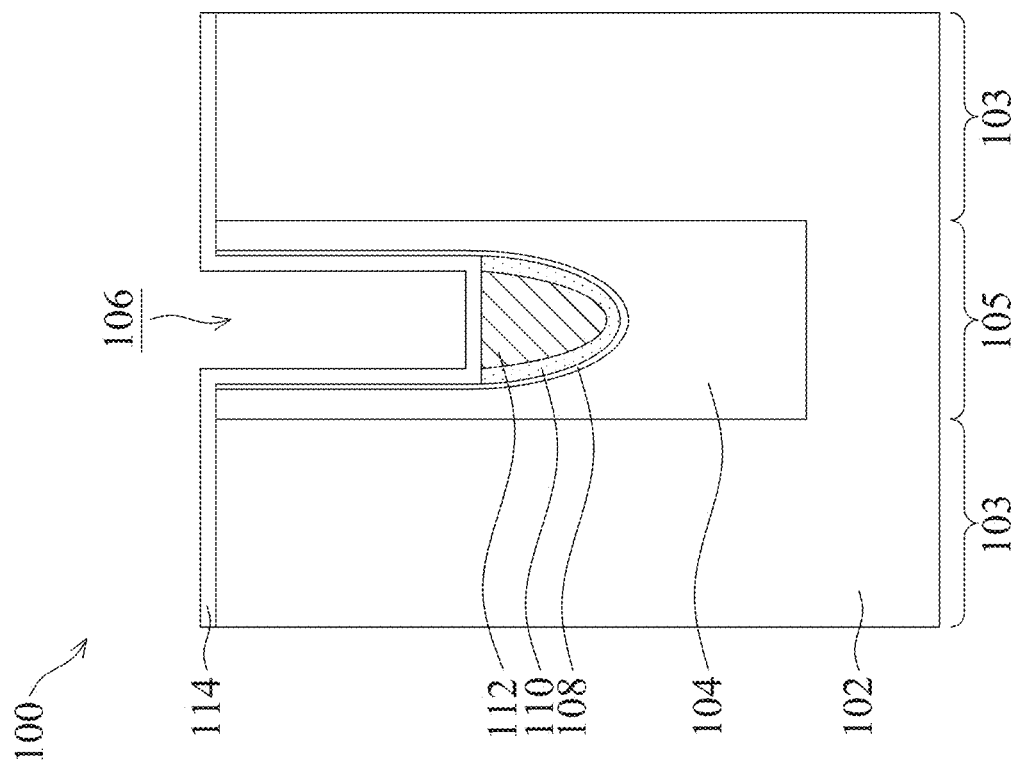
Figure 1C:
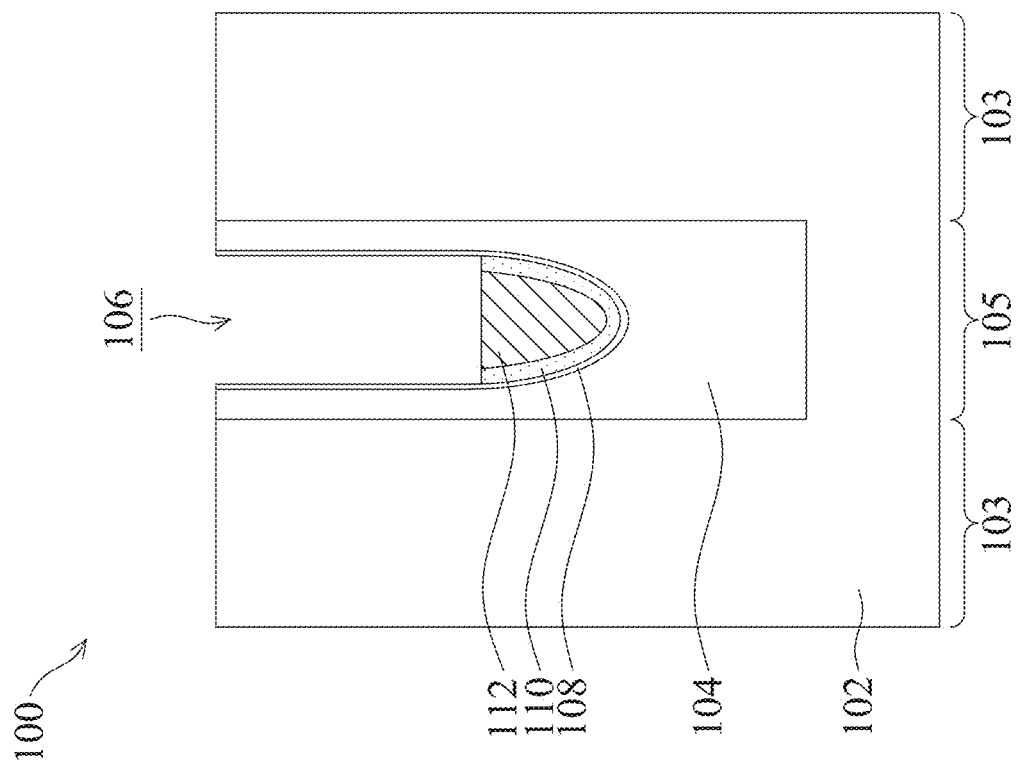

A gate dielectric layer 108, a gate lining layer 110 and a gate electrode layer 112 are sequentially formed in the trench 106, as shown in FIG. 1C. The gate lining layer 110 lines between the gate dielectric layer 108 and the gate electrode layer 112.

The gate dielectric layer 108 is formed along the sidewalls and the bottom surface of the trench 106 to partially fill the trench 106. FIG. 1C only illustrates a portion of the gate dielectric layer 108 that lines the isolation structure 104. The gate dielectric layer 108 may also include another portion that lines the active region 103 of the semiconductor substrate 102. In some embodiments, the gate dielectric layer 108 is made of silicon oxide, silicon nitride, silicon oxynitride, and/or high-k dielectric material. In some embodiments, the gate dielectric layer 108 is formed using in-situ steam generation (ISSG), CVD or ALD.

The gate lining layer 110 is formed over the gate dielectric layer 108 in a bottom portion of the trench 106 to partially fill the trench 106. In some embodiments, the gate lining layer 110 is made of titanium nitride (TiN), tungsten nitride (WN), and/or tantalum nitride (TaN). In some embodiments, the gate lining layer 110 is deposited using CVD, physical vapor deposition (PVD) and/or ALD.

The gate electrode layer 112 is formed over the gate lining layer 110 to fill the bottom portion of the trench 106. The gate electrode layer 112 is nested within the gate lining layer 110. In some embodiments, the gate electrode layer 112 is made of metal material such as tungsten (W), aluminum (Al), copper (Cu), cobalt (Co), ruthenium (Ru), and/or another metal material. In some embodiments, the gate electrode 112 is deposited using PVD, CVD, and/or ALD.

After the materials for the gate dielectric layer 108, the gate lining layer 110 and the gate electrode layer 112 are deposited, an etching back process may be performed on the gate lining layer 110 and the gate electrode layer 112.

A first sacrificial layer 114 is formed over the semiconductor substrate 102 to partially fill the trench 106, as shown in FIG. 1D. The first sacrificial layer 114 covers and extends along the sidewalls of the gate dielectric layer 108, the top surface of the gate lining layer 110 and the top surface of the gate electrode layer 112. In some embodiments, the thickness of the first sacrificial layer 114 along the gate dielectric layer 108 is equal to or greater than the thickness of the gate lining layer 110. In some embodiments, the first sacrificial layer 114 is made of dielectric material such as silicon oxide (SiO), silicon nitride (SiN), silicon oxynitride (SiON), and/or a combination thereof. An etching selectivity exists between the first sacrificial layer 114 and the isolation structure 104. In the embodiments where the isolation structure 104 is made of silicon nitride, the first sacrificial layer 114 is made of silicon oxide. In the embodiments where the isolation structure 104 is made of silicon oxide, the first sacrificial layer 114 is made of silicon nitride. The first sacrificial layer 114 may be deposited using CVD and/or ALD.

Figure 1F:
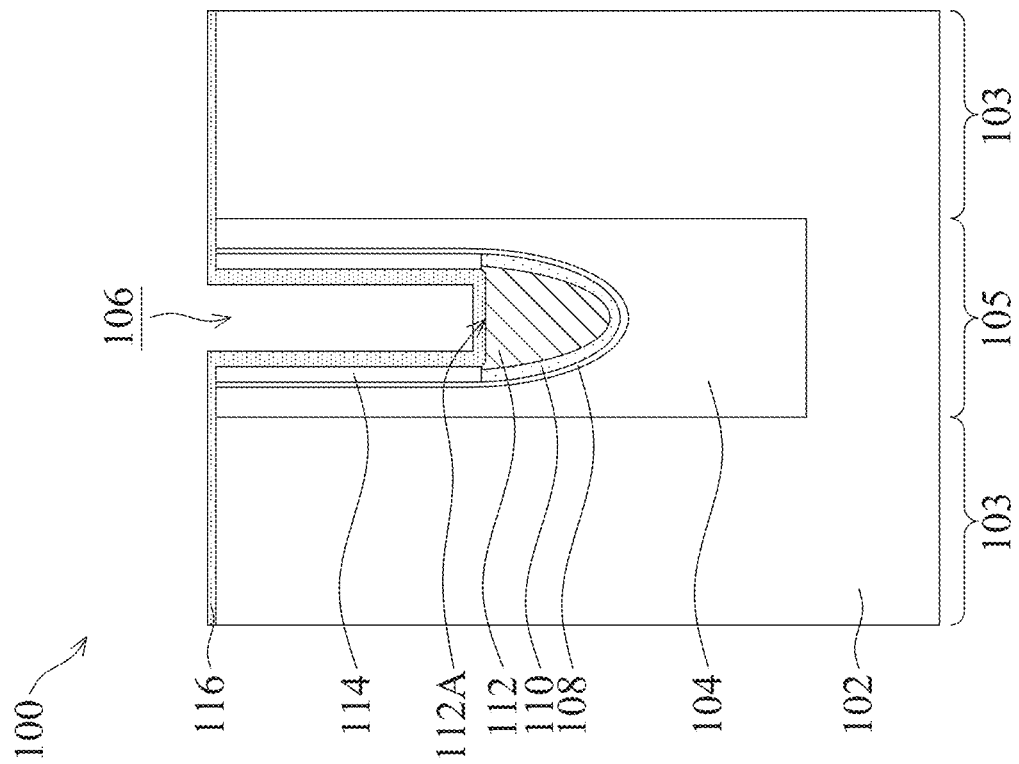
Figure 1E:
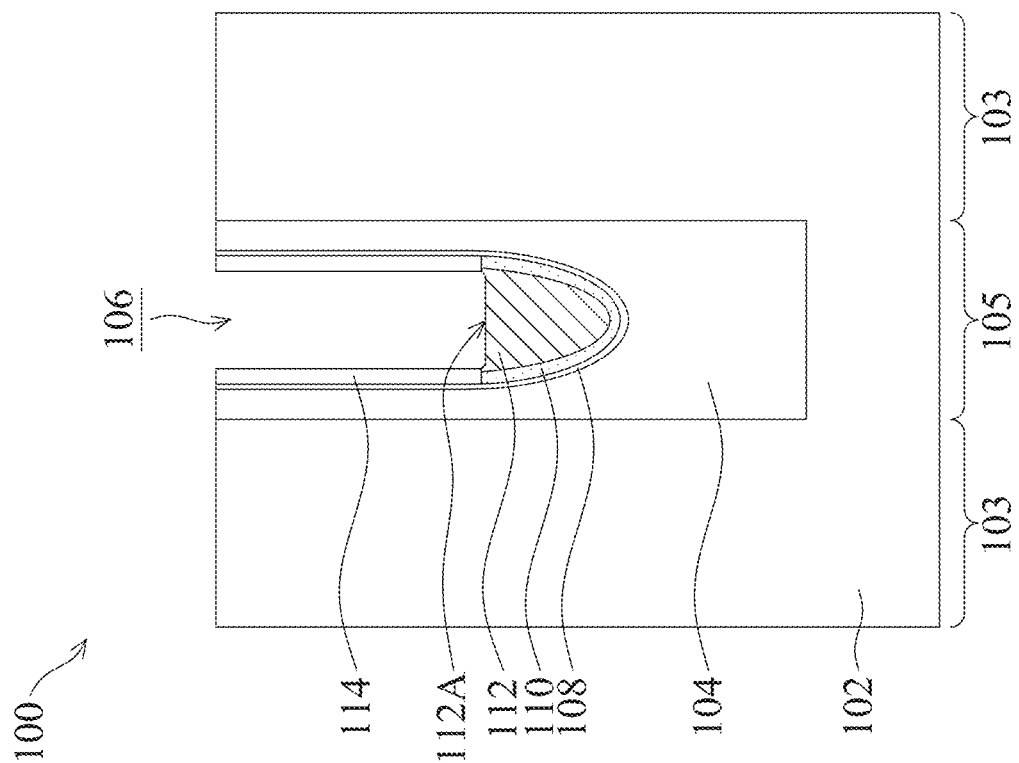

An etching process is performed on the first sacrificial layer 114 to remove horizontal portions of the first sacrificial layer 114 along the upper surface of the semiconductor substrate 102 and along the top surface of the gate electrode layer 112, as shown in FIG. 1E. After the etching process, the top surface of the gate electrode layer 112 is exposed, and a vertical portion of the first sacrificial layer 114 along the gate dielectric layer 108 remains. The vertical portion of the first sacrificial layer 114 entirely covers the top surface of the gate lining layer 110. The vertical portion of the first sacrificial layer 114 may also partially cover the gate electrode layer 112. In some embodiments, the etching process includes an over-etching step to slightly recess the gate electrode layer 112 such that the gate electrode layer 112 has a top surface 112A which is located at a lower level than the top surface of the gate lining layer 110.

A barrier layer 116 is formed over the semiconductor substrate 102 to partially fill the trench 106, as shown in FIG. 1F. The barrier layer 116 covers and extend along the sidewalls of the first sacrificial layer 114 and the top surface of the gate electrode layer 112. The barrier layer 116 is not in contact with the gate lining layer 110.

An etching selectivity exists between the barrier layer 116 and the gate electrode layer 112. In some embodiments, the barrier layer 116 is made of titanium nitride (TiN), tungsten nitride (WN), and/or tantalum nitride (TaN). In some embodiments, the barrier layer 116 is deposited using PVD, CVD and/or ALD. In some embodiments, the barrier layer 116 and the gate lining layer 110 are made of the same material.

Figure 1H:
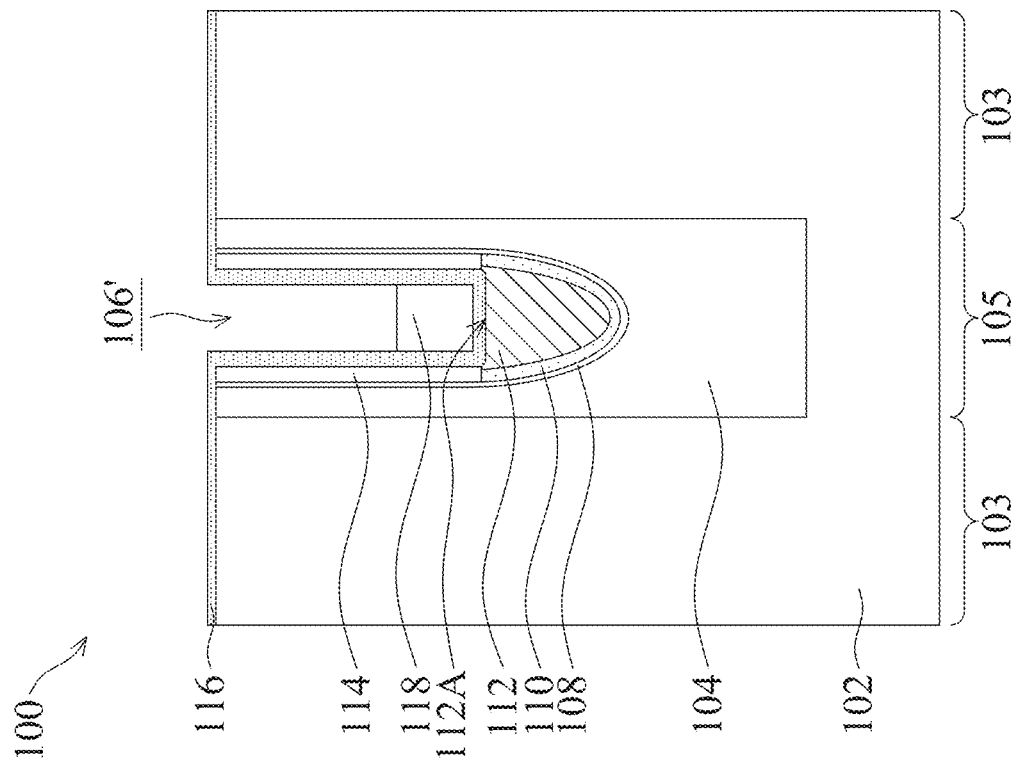
Figure 1G:
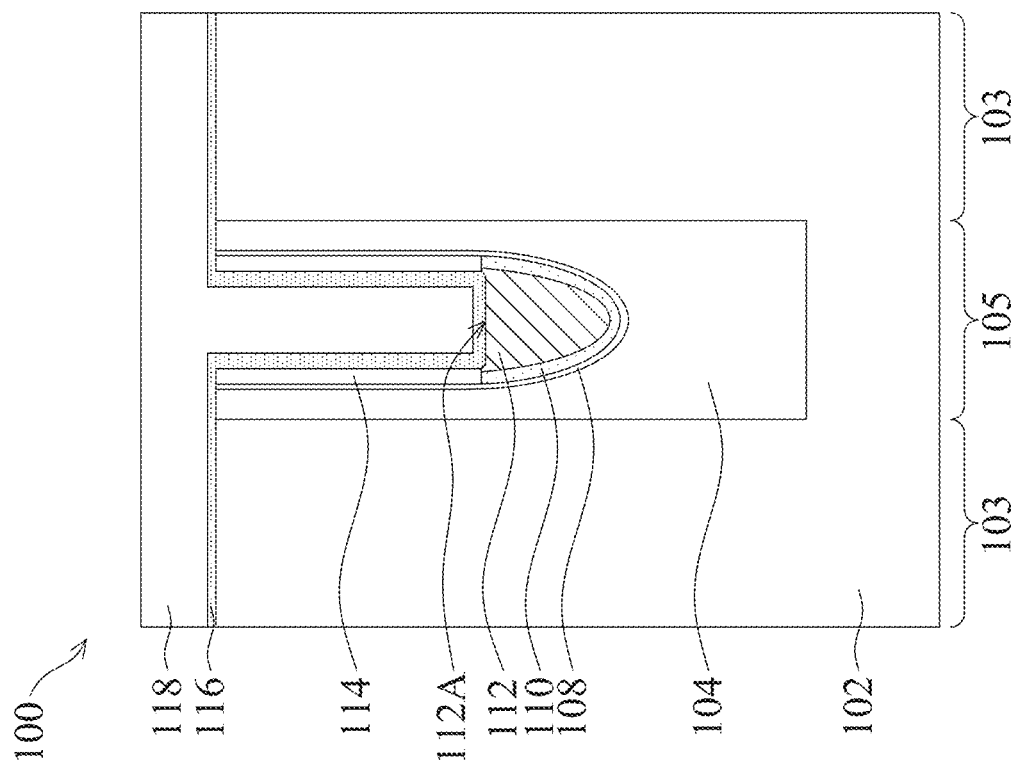

A filling layer 118 is formed over the barrier layer 116 to overfill an upper portion of the trench 106, as shown in FIG. 1G. In some embodiments, the filling layer 118 is made of carbon-rich material such as spin-on coating (SOC) carbon. The filling layer 118 may be formed using a spin-on coating process.

An etching back process is performed on the filling layer 118 to remove a portion of the filling layer 118 formed over the upper surface of the semiconductor substrate 102 and recess a portion of the filling layer 118 formed in the trench 106, as shown in FIG. 1H. After the etching back process, the upper portion of the trench 106 is formed again and referred to as a trench 106'. After the etching back process, an upper portion of the barrier layer 116 along the vertical portion of the first sacrificial layer 114 is exposed.

Figure 1I:
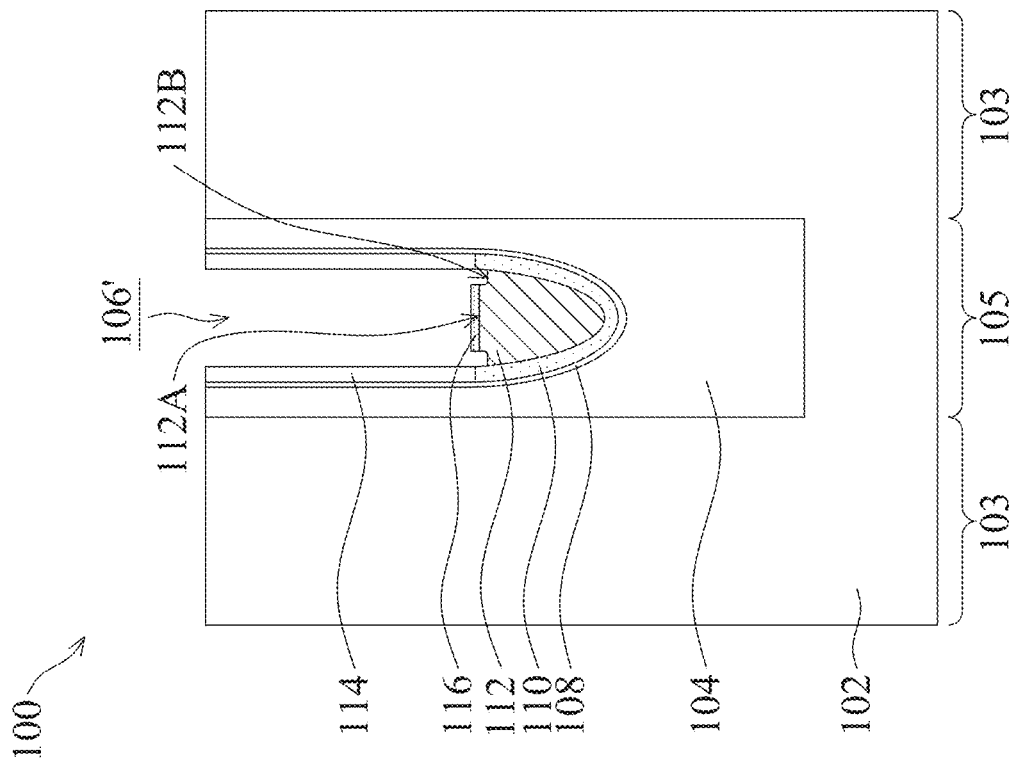

In some embodiments, one or more etching processes are performed on the barrier layer 116 to remove a portion of the barrier layer 116 over the upper surface of the semiconductor substrate 102 and a portion of the barrier layer 116 along the first sacrificial layer 114 until the gate electrode layer 112 is exposed, as shown in FIG. 1I. During the etching process, the filling layer 118 protects a horizontal portion of the barrier layer 116 along the top surface of the gate electrode layer 112 from being removed.

Because an etching selectivity exists between the barrier layer 116 and the gate electrode layer 112, the etching process may be better controlled by detecting an etching endpoint. In addition, during the etching process, the first sacrificial layer 114 covers and protects the gate lining layer 110 such that the gate lining layer 110 remains substantially unetched.

In some embodiments, the etching process may include an over-etching step to slightly recess the gate electrode layer 112 such that the gate electrode layer 112 has a top surface 112B which is located at a lower level than the top surface 112A of the gate electrode layer 112.

Figure 1J:
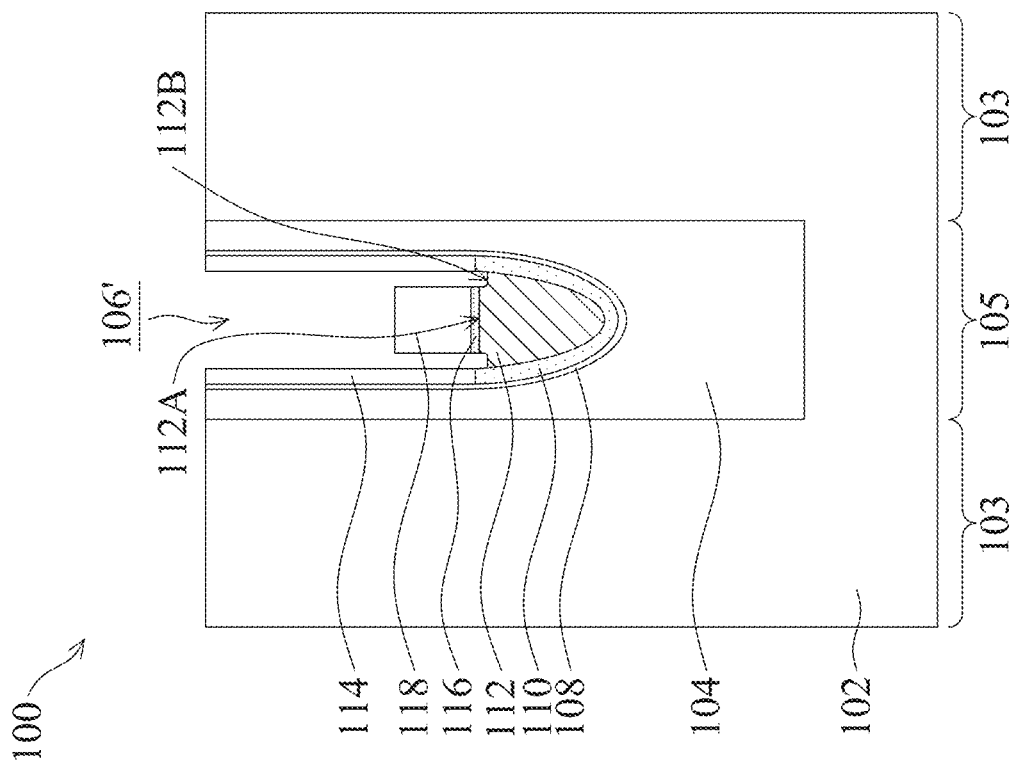

The filling layer 118 is etching away to expose the barrier layer 116, as shown in FIG. 1J.

A second sacrificial layer 120 is formed over the semiconductor substrate 102 to partially fill the trench 106', as shown in FIG. 1K. The second sacrificial layer 120 covers and extends along the sidewalls of the first sacrificial layer 114 and the top surface of the barrier layer 116. In some embodiments, the second sacrificial layer 120 is made of dielectric material such as silicon oxide (SiO), silicon nitride (SiN), silicon oxynitride (SiON), and/or a combination thereof. An etching selectivity exists between the second sacrificial layer 120 and the isolation structure 104. In some embodiments where the isolation structure 104 is made of silicon nitride, the second sacrificial layer 120 is made of silicon oxide. In some embodiments where the isolation structure 104 is made of silicon oxide, the second sacrificial layer 120 is made of silicon nitride. The second sacrificial layer 120 and the first sacrificial layer 114 may be made of the same material. FIG. 1K illustrates the interface between the first sacrificial layer 114 and the second sacrificial layer 120 for the purpose of clarity. However, there may be no interface between the first sacrificial layer 114 and the second sacrificial layer 120. The second sacrificial layer 120 may be deposited using CVD and/or ALD.

An etching process is performed on the second sacrificial layer 120 to remove horizontal portions of the second sacrificial layer 120 along the upper surface of the semiconductor substrate 102 and along the top surface of the barrier layer 116, as shown in FIG. 1L. After the etching process, the top surface of the barrier layer 116 is exposed, and a vertical portion of the second sacrificial layer 120 along the first sacrificial layer 114 remains. The top surfaces 112A and 112B of the gate electrode layer 112 are covered by the barrier layer 116 and the second sacrificial layer 120, respectively.

Figure 1N:
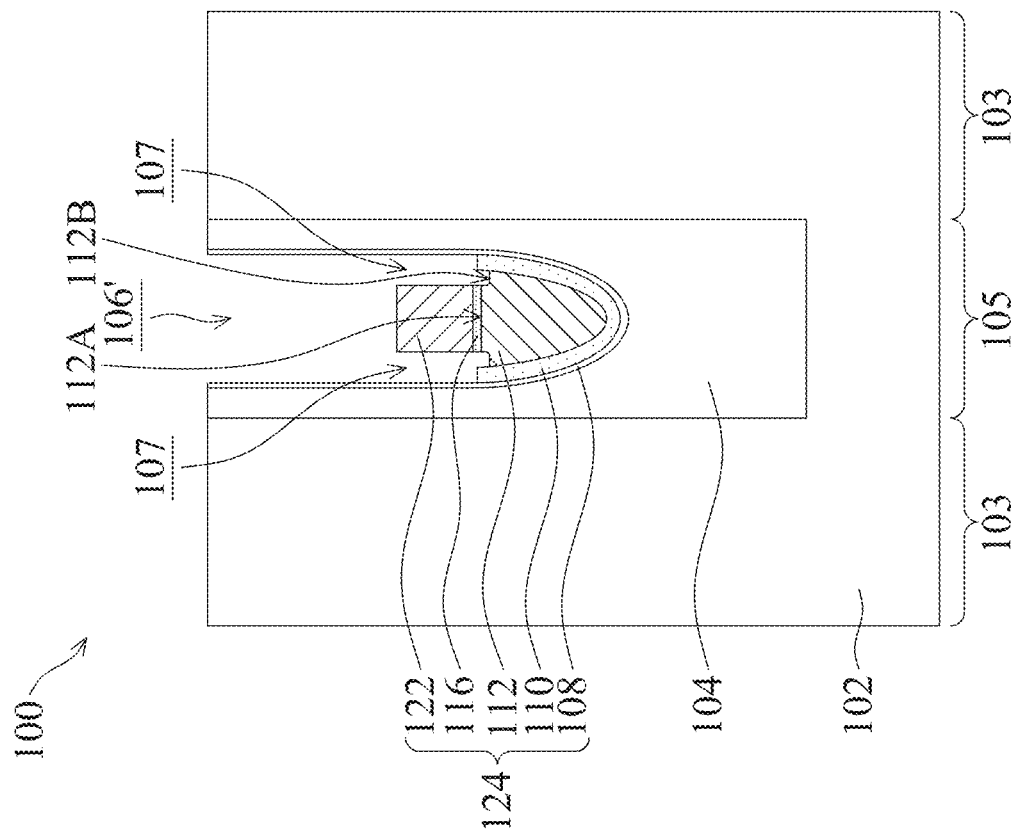
Figure 1M:
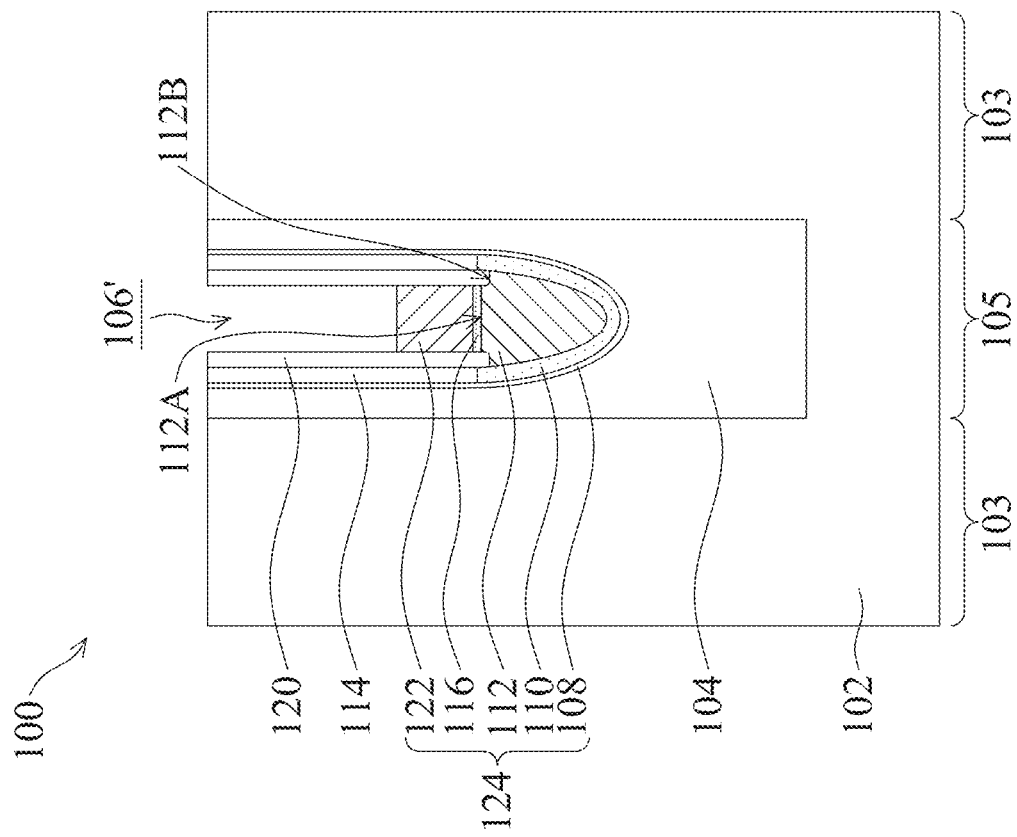

A semiconductor layer 122 is formed in the trench 106' to fill a lower portion of the trench 106', as shown in FIG. 1M. The gate dielectric layer 108, the gate lining layer 110, the gate electrode layer 112, the barrier layer 116 and the semiconductor layer 122 combine to form a gate structure 124. The gate structure 124 may be configured as a word line of the resulting semiconductor memory device, such as a buried word line (BWL). In some embodiments, the barrier layer 116 and the semiconductor layer 122 may function as work function adjusting layers of the gate structure 124. In some embodiments, the semiconductor layer 122 is made of polysilicon. In some embodiments, the formation of the semiconductor layer 122 may include depositing the semiconductor layer 122 using CVD to overfill the trench 106', and then etching back the semiconductor layer 122.

In some embodiments, the sidewalls of the semiconductor layer 122 are aligned with the sidewalls of the barrier layer 116. The widths of the semiconductor layer 122 and the barrier layer 116 are less than the maximum width of the gate electrode layer 112. For example, the ratio of the widths of the semiconductor layer 122 and the barrier layer 116 to the maximum width of the gate electrode layer 112 is in a range from about 0.5 to about 0.9. Because the top surface of the gate electrode layer 112 is covered by the second sacrificial layer 120 and the barrier layer 116, the semiconductor layer 122 may be formed not in contact with the top surface of the gate electrode layer 112. In some cases where the semiconductor layer is in contact with the gate electrode layer, the silicon from the semiconductor layer may react with the metal from the gate electrode layer to form a metal silicide, thereby increasing the overall resistance of the gate structure.

The first sacrificial layer 114 and the second sacrificial layer 120 are etched away until the gate electrode layer 112 and the gate lining layer 110 are exposed, as shown in FIG. 1N. After the etching process, a gap 107 is formed between the semiconductor layer 122 (along with the barrier layer 116) and the gate dielectric layer 108.

A capping layer 126 is formed in the trench 106', as shown in FIG. 1O. The capping layer 126 seals the gap 107 to form air gaps 128 between the semiconductor layer 122 (along with the barrier layer 116) and the gate dielectric layer 108.

Additional features, e.g., source/drain regions in the semiconductor substrate 102, contact plugs connecting to the source/drain regions, bit lines, capacitors, and/or another component, may be formed over the semiconductor structure 100, thereby forming a semiconductor memory device. In some embodiments, the semiconductor memory device is DRAM.

In accordance with some embodiments, the gate structure 124 includes dual work function adjusting layer (i.e., the barrier layer 116 and the semiconductor layer 122), which may reduce the intensity of the electrical field generated by the gate electrode layer 112 of the gate structure 124, thereby reducing gate induced drain leakage (GIDL). In addition, the semiconductor structure 100 includes the air gaps 128 on the opposite sides of the semiconductor layer 122 (along with the barrier layer 116), which may further reduce GIDL, thereby increasing the reliability and the manufacturing yield of the semiconductor memory device. Furthermore, in accordance with some embodiments, the dual work function adjusting layer of the gate structure 124 is formed without using an additional mask. As a result, the limit of the overlay window of the photolithography process may be avoided.

Furthermore, in accordance with some embodiments, by forming the first sacrificial layer 114 to protect the gate lining layer 110, the loss of the gate lining layer 110 may be significantly reduced during the etching process of the barrier layer 116 and the endpoint of the etching process may be better controlled. Furthermore, the second sacrificial layer 120 is formed to cover the top surface 112B of the gate electrode layer 112, which may prevent the semiconductor layer 122 from being in contact with the gate electrode layer 112 to form metal silicide. As a result, the increase in resistance of the gate structure 124 due to the formation of metal silicide may be avoided.

Figure 2:
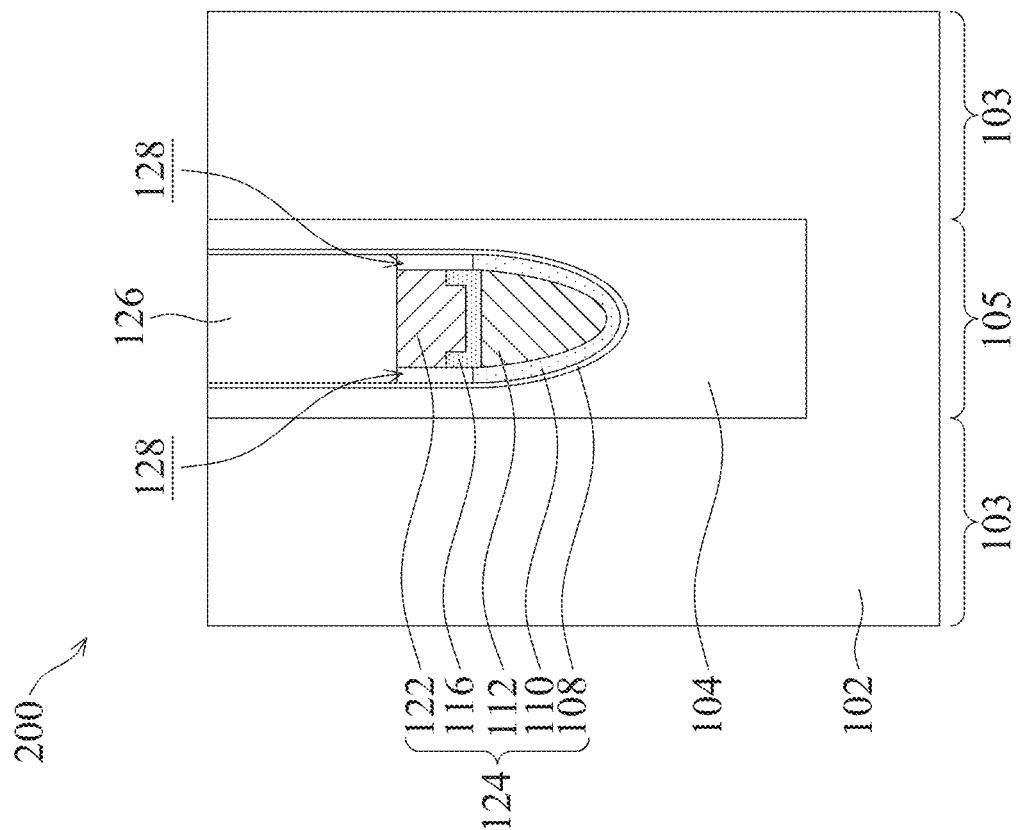
FIG. 2 is a modification of the semiconductor structure of FIG. 1O, in accordance with some embodiments of the present disclosure.
Figure 10:
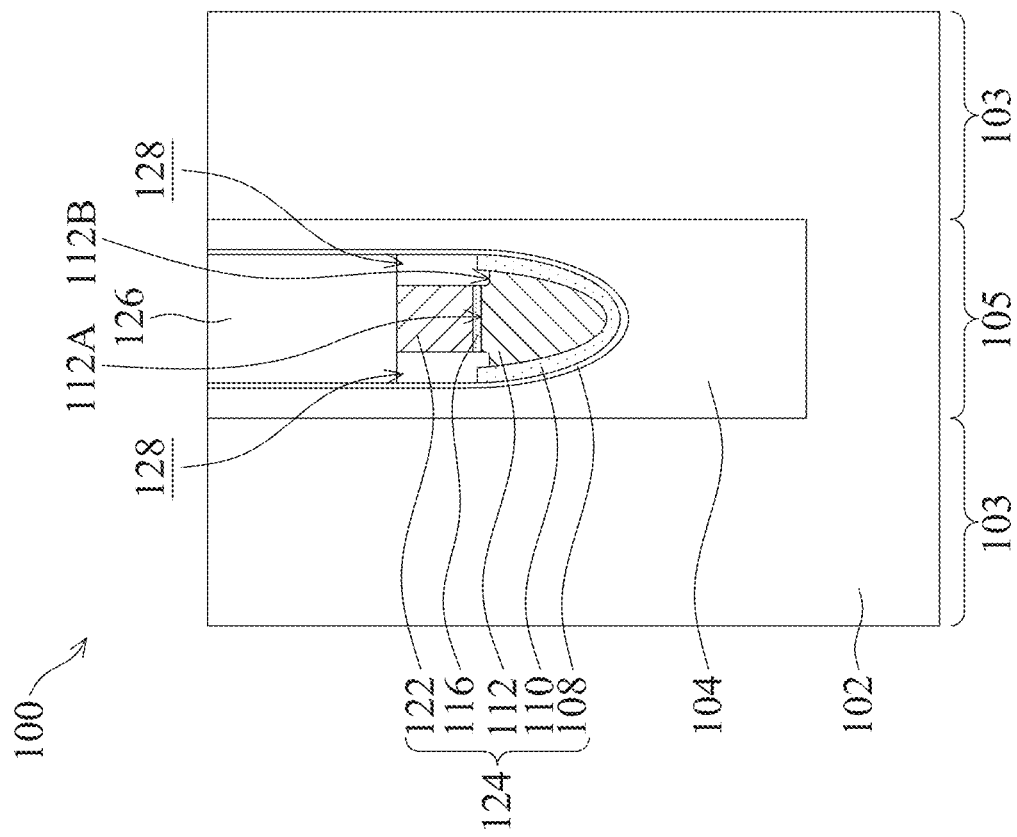

FIG. 2 is a modification of the semiconductor structure of FIG. 1O, in accordance with some embodiments of the present disclosure. A semiconductor structure 200 shown in FIG. 2 is similar to the semiconductor structure 100 of FIG. 1O except that the barrier layer 116 surrounds a bottom portion of the semiconductor layer 122.

In the steps as described above in FIG. 1I, the vertical portion of the barrier layer 116 along the first sacrificial layer 114 is partially etched away. After the etching process, the residue of the barrier layer 116 has a U-shape profile. The gate electrode layer 112 is covered by the residue of the barrier layer 116 and is not exposed. Next, the steps as described above in FIG. 1J are performed to remove the filling layer 118 and expose the barrier layer 116.

The steps as described above in FIGS. 1K and 1L may be omitted, and the steps as described above in FIGS. 1M and 1O are performed. The semiconductor layer 122 is formed in the trench 106'. The semiconductor layer 122 includes a lower portion surrounded by the barrier layer 116 and an upper portion formed over the top surface of the barrier layer 116, as shown in FIG. 2. The capping layer 126 is formed in the trench 106' to form the air gaps 128 between the semiconductor layer 122 (along with the barrier layer 116) and the gate dielectric layer 108, thereby producing the semiconductor structure 200.

As described above, the embodiments of the present disclosure provide a semiconductor structure including an embedded gate structure and a method for forming the same. The embedded gate structure includes the dual work function adjusting layer and the air gaps on the opposite sides of the dual work function adjusting layer. Therefore, the GIDL may be reduced, which may increase the reliability and the manufacturing yield of the semiconductor memory device.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a semiconductor substrate;
   a gate structure embedded in the semiconductor substrate, the gate structure comprising:
      a gate electrode layer;
      a barrier layer disposed over the gate electrode layer;
      a semiconductor layer disposed over the barrier layer; and
      a gate lining layer, wherein the gate electrode layer is nested within the gate lining layer; and
   an air gap in the semiconductor substrate exposing the barrier layer and the semiconductor layer, wherein the gate electrode layer has a first top surface that is exposed from the air gap and a second top surface that is interfaced with the barrier layer and higher than the first top surface of the gate electrode layer,
   wherein a top surface of the gate lining layer is higher than the second top surface of the gate electrode layer.

2. The semiconductor structure as claimed in claim 1, further comprising:
   a capping layer disposed over the gate structure and sealing the air gap.

3. The semiconductor structure as claimed in claim 1, wherein a sidewall of the semiconductor layer is aligned with a sidewall of the barrier layer.

4. The semiconductor structure as claimed in claim 1, wherein a width of the barrier layer is less than a width of the gate electrode layer.

5. The semiconductor structure as claimed in claim 1, further comprising:
   an isolation structure disposed in the semiconductor substrate, wherein at least a portion of the gate structure is embedded in the isolation structure.

6. The semiconductor structure as claimed in claim 1, wherein the semiconductor layer is made of polysilicon and the barrier layer is made of titanium nitride.

7. The semiconductor structure as claimed in claim 1, wherein the gate structure is configured as a word line of a memory device.

8. The semiconductor structure as claimed in claim 1, wherein the gate electrode layer is made of metal material.

9. The semiconductor structure as claimed in claim 1, wherein the gate electrode layer is selected from tungsten (W), aluminum (Al), copper (Cu), cobalt (Co), ruthenium (Ru), or a combination thereof.

10. The semiconductor structure as claimed in claim 1, wherein the barrier layer is selected from titanium nitride (TiN), tungsten nitride (WN), or tantalum nitride (TaN).

11. The semiconductor structure as claimed in claim 1, wherein the semiconductor layer is made of polysilicon material.

12. The semiconductor structure as claimed in claim 1, wherein the gate lining layer is selected from titanium nitride (TiN), tungsten nitride (WN), or tantalum nitride (TaN).

13. A semiconductor structure, comprising:
   a semiconductor substrate;
   a gate structure embedded in the semiconductor substrate, wherein the gate structure comprises:
      a gate electrode layer;
      a barrier layer disposed over the gate electrode layer; and
      a semiconductor layer disposed over the barrier layer;
   an isolation structure disposed in the semiconductor substrate, wherein at least a portion of the gate structure is embedded in the isolation structure; and
   an air gap in the semiconductor substrate exposing the barrier layer and the semiconductor layer, wherein the gate electrode layer has a first top surface that is exposed from the air gap and a second top surface that is interfaced with the barrier layer and higher than the first top surface of the gate electrode layer,
   wherein the gate structure further comprises:
      a gate dielectric layer lining the isolation structure, wherein the air gap exposes a portion of the gate dielectric layer.

14. The semiconductor structure as claimed in claim 13, wherein the gate dielectric layer is selected from silicon oxide, silicon nitride, silicon oxynitride, or high-k dielectric material.

\* \* \* \* \*